(12) United States Patent
Terashi et al.

(10) Patent No.: US 6,660,670 B2
(45) Date of Patent: Dec. 9, 2003

(54) CERAMICS AND METHOD OF PREPARING THE SAME

(75) Inventors: Yoshitake Terashi, Kokubu (JP); Hiromi Iwachi, Kokubu (JP); Tsutae Iryo, Kokubu (JP)

(73) Assignee: Kyocera Corporation, Kyoto (JP)

( * ) Notice: Subject to any disclaimer, the term of this patent is extended or adjusted under 35 U.S.C. 154(b) by 56 days.

(21) Appl. No.: 09/998,366

(22) Filed: Nov. 29, 2001

(65) Prior Publication Data

US 2002/0098965 A1 Jul. 25, 2002

(30) Foreign Application Priority Data

Nov. 30, 2000 (JP) ......................................... 2000-364763

(51) Int. Cl.$^7$ ........................... C03C 10/04; C03C 10/08
(52) U.S. Cl. ................................ 501/5; 501/9; 65/33.7; 428/210
(58) Field of Search .................. 501/5, 9, 32; 428/210; 65/33.7

(56) References Cited

U.S. PATENT DOCUMENTS

| | | | | |
|---|---|---|---|---|
| 4,714,687 A | * | 12/1987 | Holleran et al. | ................. 501/9 |
| 5,061,307 A | * | 10/1991 | Matano et al. | ................. 65/18.4 |
| 6,413,620 B1 | * | 7/2002 | Kimura et al. | .............. 428/210 |

* cited by examiner

*Primary Examiner*—Karl Group
(74) *Attorney, Agent, or Firm*—Hogan & Hartson

(57) ABSTRACT

Ceramics containing a diopside crystal phase and a cordierite phase, the remainder being a glass phase and/or other ceramic crystal phases, and having an open porosity of not larger than 1%. The ceramics is obtained by firing at from 800 to 1050° C., and exhibits a dielectric constant of not larger than 7 and a small dielectric loss in a high-frequency region, a ceramic strength of not smaller than 250 MPa, and a coefficient of thermal expansion close to those of the chips such as of Si and Ga—As and of the printed board.

15 Claims, 1 Drawing Sheet

CERAMICS AND METHOD OF PREPARING THE SAME

BACKGROUND OF THE INVENTION

1. Field of the Invention

The present invention relates to ceramics suited for use as packages for accommodating semiconductor devices and as insulating substrates for wiring boards such as multi-layer wiring boards. More specifically, the invention relates to low-temperature-fired ceramics having a large strength which can be co-fired together with a low-resistance conductor such as copper or silver, and which, particularly, makes it easy to adjust the dielectric constant and the coefficient of thermal expansion, to a method of preparing the same, as well as to a wiring board using the ceramics as an insulating substrate.

2. Description of the Prior Art

As the ceramic multi-layer wiring boards, there have heretofore been most widely used those obtained by forming a wiring layer of a high-melting metal such as tungsten or molybdenum on the surface or inside of the insulating substrate formed of a sintered article of alumina.

In modern era of highly sophisticated information technology, further, the frequency band which is allowed to be used is shifting toward the ever higher zones. In the high-frequency wiring boards that must transmit signals of such high frequencies, it is a requirement to decrease the resistance of the conductor forming the wiring layer from the standpoint of transmitting high-frequency signals without loss as well as to decrease the dielectric loss of the insulating substrate in the high-frequency regions.

However, the conventional high-melting metals such as tungsten (W) and molybdenum (Mo) have large resistances, transmit signals at slow speeds, and are not capable of transmitting signals in the high-frequency regions of not lower than 1 GHz. Therefore, it has been desired to use low-resistance metals such as copper, silver and gold in place of tungsten and molybdenum.

However, the metallized wiring layers of such low-resistance metals have low melting points and cannot be co-fired with alumina. In recent years, therefore, there has been developed a wiring board by using, as an insulating substrate, a so-called glass ceramics using a glass or a composite material of the glass and ceramics.

However, the conventional glass ceramics have a small strength and low mechanical reliability. Besides, with the insulating substrate formed of such ceramics, the wiring layer formed on the surface thereof is peeled off together with the insulating substrate due to tensile stress built up in the wiring layer, making it difficult to enhance the metallizing strength.

According to Japanese Unexamined Patent Publication (Kokai) No. 120436/1998 and 49531/1999, there have been proposed ceramics obtained by adding ceramic powders such as of alumina and mullite to a glass powder capable of precipitating a diopside crystal phase, and firing the mixture. There have been disclosed that the ceramics feature decreased dielectric losses in the microwave band, and strengths which are increased up to 2200 kg/cm$^2$.

According to Japanese Unexamined Patent Publication (Kokai) No. 120436/1998 and 49531/1999, however, the ceramic strengths can be increased only up to about 2200 kg/cm$^2$, and it has been desired to further increase the ceramic strengths from the standpoint of enhancing the metallizing strength of the wiring layer. As for the ceramics to which alumina and mullite are added as fillers, it is desired to decrease the dielectric constants and dielectric losses, since they exhibit large dielectric constants and dielectric losses in the high-frequency bands.

There has further been proposed a method of preparing ceramics by adding cordierite as a filler to a glass powder capable of precipitating a diopside crystal phase, and firing the mixture thereof leaving, however, a problem in that the ceramic density is not heightened due to poor wettability between the diopside crystal phase that is precipitated and the cordierite, and that the ceramic strength decreases due to an increase in the open porosity (e.g., not smaller than 2%).

SUMMARY OF THE INVENTION

It is therefore an object of the present invention to provide a low-temperature-fired ceramics which is made dense being fired at from 800 to 1050° C. at which it can be co-fired together with a low-resistance conductor for forming a wiring layer such as of gold, silver or copper, the ceramics exhibiting good dielectric properties even in high-frequency regions and a large strength, a method of preparing the same, and a wiring board using the above ceramics.

The present inventors have discovered the fact that ceramics having a large strength can be obtained by molding a mixture of a glass capable of precipitating a diopside crystal phase and a glass capable of precipitating a cordierite crystal phase, and by firing the molded article under predetermined conditions, the ceramics capable of being co-fired with copper or silver and exhibiting excellent dielectric properties in a high-frequency band, and have thus arrived at the present invention.

According to the present invention, there is provided ceramics containing a diopside crystal phase and a cordierite phase, the remainder being a glass phase and/or other ceramic crystal phases, and having an open porosity of not larger than 1%.

In the ceramics of the present invention, it is desired that:
(a) The total content of the diopside crystal phase and the cordierite crystal phase is not smaller than 50% by weight;
(b) Both the diopside crystal phase and the cordierite crystal phase are those precipitated from the glasses; and
(c) The flexural strength is not smaller than 250 MPa, the Vickers' hardness is not smaller than 650, the dielectric constant is not larger than 8, and the dielectric loss at 60 GHz is not larger than $20 \times 10^{-4}$.

According to the present invention, further, there is provided a method of preparing ceramics comprising:
preparing a mixed powder containing a first glass powder capable of precipitating a diopside crystal phase and a second glass powder capable of precipitating a cordierite crystal phase;
molding the mixed powder; and
firing the obtained molded article at a temperature of from 800 to 1050° C., so that the diopside crystal phase and the cordierite crystal phase are precipitated from the first and second glasses, respectively.

According to the method of preparing ceramics of the present invention, it is desired that:
(d) Not smaller than 80% by weight of the first glass powder and the second glass powder are crystallized into the diopside crystal phase and the cordierite crystal phase;
(e) The firing is conducted in two steps of from 800 to 900° C. and from 910 to 1000° C.; and
(f) The mixed powder contains a ceramic powder that is not decomposed by the firing.

According to the present invention, there is further provided a wiring board comprising an insulating substrate provided with a wiring layer, the insulating substrate being formed of the ceramics.

In the wiring board of the present invention, the wiring layer is formed on the surface and/or inside of the insulating substrate, the wiring layer, desirably, containing copper or silver as a conducting component.

DETAILED DESCRIPTION OF THE INVENTION

Figure 1:
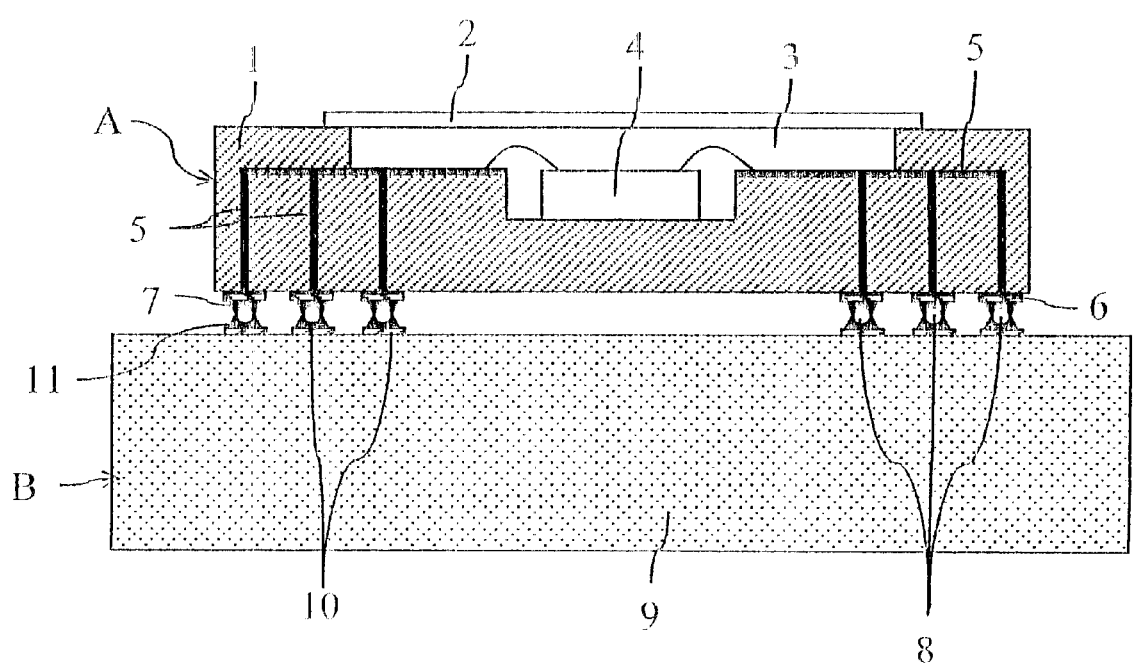
FIG. 1 is a sectional view schematically illustrating the mounted structure of a package for accommodating a semiconductor device which is a high-frequency wiring board using the ceramics of the invention as an insulating substrate.

The ceramics of the present invention contains a diopside crystal phase and a cordierite crystal phase as crystal phases, and has a great feature in that the open porosity is not larger than 1% and, particularly, not larger than 0.5%. In connection with these features, the ceramics of the present invention has a large strength and such dielectric properties as a low dielectric constant and a low dielectric loss in the millimeter wave band, and further has excellent resistance against water and chemicals and excellent surface smoothness.

In order to increase the ceramic strength and improve dielectric properties in the present invention, it is desired that the total content of the diopside crystal phase and of the cordierite crystal phase is not smaller than 50% by weight, particularly, not smaller than 55% by weight and, more particularly, not smaller than 60% by weight.

In the present invention, it is desired that both the diopside crystal phase and the cordierite crystal phase are precipitated from the glass phase, whereby the open porosity is suppressed to lie in the above-mentioned range. With these crystal phases being precipitated from the glasses, further, the ceramics of the present invention usually contains a glass phase on the grain boundaries of the crystal phases. Here, from the standpoint of lowering the dielectric loss and increasing the ceramic strength, it is desired that the content of the glass phase is not larger than 10% by weight, particularly, not larger than 5% by weight and, particularly preferably, not larger than 2% by weight.

In the ceramics of the present invention, the diopside crystal phase has a composition expressed by the formula, $Ca(Mg, Al)(Si, Al)_2O_6$, and may contain SrO therein in the form of a solid solution. Further, analogous crystal phases of the diopside crystal phase may include $Ca_2MgSi_2O_7$ (akermanite), $CaMgSiO_4$ (monticellite), $Ca_3MgSi_2O_8$ (merwinite) and the like. The cordierite crystal phase is expressed by, for example, the formula, $Mg_2Al_4Si_5O_{18}$, and may be of the low-temperature cordierite ($\alpha$-cordierite) crystals, of the high-temperature cordierite ($\beta$-cordierite) crystals, or the indialite crystals. There may be often precipitated a crystal phase other than the cordierite crystals of a composition expressed by $Mg_2Al_4Si_5O_{18}$. In such a case, it is desired that the amount of precipitation of this phase is not larger than 20% by weight and, particularly, not larger than 10% by weight from the standpoint of decreasing the dielectric loss.

Further, the ceramics of the present invention may contain an oxide of a rare earth element in an amount of from 0.1 to 20% by weight calculated as $RE_2O_3$ (RE: rare earth element) in order to decrease the dielectric loss. As the rare earth element (RE), there can be used at least the one selected from the group consisting of Y, Yb, Ce, Nd, Sm, Eu, La, Pr and Dy. From the standpoint of decreasing the dielectric loss, in particular, it is desired to use Yb.

In order to increase the ceramic strength, it is desired to contain a ceramic crystal phase of at least one kind selected from the group consisting of alumina, mullite, forsterite, enstatite, cordierite, anorthite, slawsonite, celsian, spinel, gahnite, silica, zirconia, titania, $MgTiO_3$, $(Mg, Zn)TiO_3$, $Mg_2TiO_4$, $Zn_2TiO_4$, $CaTiO_3$, $SrTiO_3$, $Si_3N_4$, SiC and AlN in a total amount of not larger than 50% by weight, particularly, not larger than 45% by weight and, more particularly, in a range of from 10 to 40% by weight.

When the total amount of the metal elements, i.e., Si, Al, Mg and Ca is 100% by weight calculated as oxides thereof, then, the ceramics of the present invention contains metal elements at the following ratios: i.e., $SiO_2$: 16 to 56% by weight and, particularly, 32 to 56% by weight, $Al_2O_3$: 9 to 89% by weight and, particularly, 9 to 39% by weight, MgO: 5 to 29% by weight and, particularly, 10 to 29% by weight, and CaO: 1 to 19% by weight and, particularly, 2 to 19% by weight, and has a dielectric constant of not larger than 8, particularly, not larger than 7 and, more particularly, not larger than 6, and has a dielectric loss at 60 GHz of not larger than $20\times10^{-4}$, particularly, not larger than $15\times10^{-4}$, more particularly, not larger than $12\times10^{-4}$ and, most particularly, not larger than $10\times10^{-4}$.

The ceramics of the present invention having the above-mentioned properties is very useful as an insulating substrate for a wiring board used in high-frequency regions of not lower than 1 GHz, particularly, not lower than 20 GHz, more particularly, not lower than 50 GHz and, most particularly, not lower than 60 GHz. It is, further, desired that the ceramics has a coefficient of thermal expansion at room temperature up to 400° C. of from $2.5\times10^{-6}$ to $9\times10^{-6}/°$ C. and, particularly, from $4\times10^{-6}$ to $7.5\times10^{-6}/°$ C. from the standpoint of matching with the coefficient of thermal expansion of such semiconductor devices as Si and Ga—As.

The ceramics of the present invention has a ceramic strength of not smaller than 250 MPa, particularly, not smaller than 300 MPa, and a Vickers' hardness of not smaller than 650 and, particularly, not smaller than 700. Therefore, use of the ceramics as an insulating substrate for the wiring board makes it possible to prevent the occurrence of cracks caused by thermal stress due to the mounting of electronic parts such as semiconductor devices, to increase the metallized strength, and to increase the mechanical reliability of the wiring board.

The ceramics has a dielectric constant of as small as 8 or smaller and is capable of suppressing the dielectric loss in the millimeter wave band. By using the insulating substrate formed of the above ceramics, it is allowed to decrease the transmission loss through the high-frequency transmission line and the antennas.

With the wiring board in which the insulating substrate is formed of the ceramics of the present invention as described above, the coefficient of thermal expansion of the insulating substrate (ceramics) at room temperature up to 400° C. is close to that of the semiconductor device that is mounted. This prevents the occurrence of cracks or peeling caused by the thermal stress between the two when the semiconductor device is mounted by soldering or due to the recurring heat cycle of when the semiconductor device is started and stopped, improving electrical reliability of the wiring connecting the two.

(Method of Preparation)

Next, descrined below is a method of preparing the ceramics of the present invention.

Starting Materials:

As the starting materials, there is used a mixed powder of a glass powder (first glass powder) capable of precipitating a diopside crystal phase and a glass powder (second glass powder) capable of precipitating a cordierite crystal phase.

The first glass powder is the one for precipitating the diopside crystal phase and, hence, contains at least $SiO_2$, $Al_2O_3$, MgO and CaO. To easily remove the binder and to enhance the crystallinity, further, it is desired that the first glass powder has a softening point of from 500 to 800° C. and may contain SrO from the standpoint of being fired at a low temperature. In order that the diopside crystal phase is precipitated from the first glass at an increased rate, further, it is desired that the total amount of CaO and MgO is from 35 to 50% by weight.

Described below are preferred examples of the composition of the first glass powder.

FIRST PREFERRED EXAMPLE

SiO2: 30 to 55% by weight $Al_2O_3$: 4.5 to 15% by weight

MgO: 16 to 35% by weight

CaO: 24 to 40% by weight

SECOND PREFERRED EXAMPLE $SiO_2$: 30 to 55% by weight $Al_2O_3$: 4 to 15% by weight MgO: 14 to 30% by weight CaO: 5 to 20% by weight SrO: 15 to 25% by weight The second glass powder is the one for precipitating the cordierite crystal phase and, hence, contains at least Al, Si and Mg. The second glass powder usually has, for example, the following composition;

$SiO_2$: 40 to 57% by weight $Al_2O_3$: 27 to 40% by weight

MgO: 10 to 19% by weight but may further contain other additives, such as an oxide of at least one element selected from the above-mentioned rare earth elements. It is further desired that the second glass powder has a softening point of from 600 to 980° C. and, particularly, from 850 to 980° C.

In the above-mentioned mixed powder of the first glass powder and the second glass powder, it is desired that the first glass powder is contained in an amount of from 0.5 to 99.5% by weight, particularly, from 30 to 80% by weight and, more particularly, from 40 to 60% by weight and that the second glass powder is contained in an amount of from 0.5 to 99.5% by weight, particularly, from 30 to 80% by weight and, more particularly, from 40 to 60% by weight. By using the mixed powder containing the first glass powder and the second glass powder at such a ratio of amounts, it is allowed to obtain dense ceramics having an open porosity of not larger than 1% by firing in a temperature region where it can be co-fired with such a low-resistance conductor as silver or copper, maintaining improved ceramic strength and effectively suppressing the dielectric constant of the ceramics and the dielectric loss.

In order to form the above-mentioned other ceramic crystal phase, furthermore, the mixed powder may contain the above-mentioned ceramic powder (ceramic filler) that does not undergo the decomposition upon firing in an amount of not larger than 50% by weight, particularly, not larger than 45% by weight and, more particularly, in an amount of from 10 to 40% by weight.

Molding and Firing:

The above-mentioned mixed powder is molded into a predetermined shape by a known molding method such as doctor blade method, calender roll method, rolling method or press-molding method, and is then subjected to the binder-removing treatment at 500 to 750° C. followed by firing in an oxidizing atmosphere or in an inert atmosphere at 800 to 1050° C. to obtain the ceramics of the present invention.

When the molded article is to be co-fired with a conductor such as copper which may be oxidized through the firing, it is desired to conduct the firing in a weakly acidic atmosphere such as the water vapor-containing atmosphere. It is further desired that the firing atmosphere is the nonoxidizing atmosphere such as of nitrogen, nitrogen-hydrogen or nitrogen-inert gas. When the firing temperature is not higher than 800° C., the ceramics is not densely formed, the crystallinity becomes low, the content of the glass phase is not decreased in the ceramics, and the dielectric loss increases in the high-frequency region. When the firing temperature exceeds 1000° C., on the other hand, the molded article cannot be co-fired with the low-resistance metal such as Cu or Ag.

In order to densely form the ceramics through the firing of not higher than 1000° C., it is desired that the temperature during the firing is raised at a rate not larger than 1000° C./hour and that the firing is conducted for not shorter than 10 minutes. In order to increase the crystallinity of the diopside crystal phase and of the cordierite crystal phase in the ceramics, further, it is desired that the temperature during the firing is raised at a rate not larger than 1000° C./hour.

In the present invention, it is desired that the firing is conducted in two steps, i.e., the first step of firing at from 800 to 900° C. and, particularly, from 850 to 875° C. and a second step of firing at from 910 to 1050° C. and, particularly, from 950 to 975° C., so that the diopside crystal phase and the cordierite crystal phase possess crystallinities (ratio of crystal phase precipitation per the starting glass powder) of not smaller than 80% and, particularly, not smaller than 90%. In this case, it is desired that the molded article is held in the firing temperature region of the first step for not shorter than 30 minutes and is held in the firing temperature region of the second step for not shorter than 30 minutes.

According to the present invention which conducts the firing in two steps as described above, the starting glass powder can be oozed on the surface of the ceramics during the firing, whereby the porosity on the surface of the obtained ceramics is rendered to be smaller than the porosity inside the ceramics, and the content of the glass in the surface of the ceramics is rendered to be higher than that in the ceramics. When the ceramics is used as the insulating substrate, therefore, the wiring layer formed on the surface of the insulating substrate is strongly metallized.

Preparation of the Wiring Board:

To prepare the wiring board equipped with the insulating substrate formed of the above-mentioned ceramics according to the present invention, a slurry is prepared by mixing a suitable organic solvent and a solvent into the above-mentioned mixed powder, and forming the slurry into a sheet relying upon a widely known doctor blade method, calendar roll method, rolling method or press-molding method. Through holes are, as desired, formed in the sheet-like molded article (green sheet) and are filled with a metal paste containing at least one of copper, gold or silver. On the surface of the green sheet is pattern-printed a wiring layer such as a high-frequency line capable of transmitting signals of high frequencies by a screen-printing method or a gravure-printing method by using the above-mentioned metal paste. The thickness of the pattern is such that the wiring layer that is finally obtained is from 5 to 30 μm in thickness.

Thereafter, plural green sheets (sheet-like molded articles) are positioned and laminated one upon the other and are adhered together. The laminate is, then, fired in a non-oxidizing atmosphere such as of a nitrogen gas or a nitrogen-oxygen mixed gas under the above-mentioned conditions to prepare a high-frequency wiring board equipped with the insulating substrate formed of the above-mentioned ceramics.

On the surface of the wiring board (insulating substrate) is suitably mounted and connected a chip such as a semiconductor device so that the signals can be transmitted between the wiring layer and the chip. As for the connection method, the chip is directly mounted on the wiring layer, or the chip is adhered onto the surface of the insulating substrate using a resin or such a resin as Ag-epoxy, Ag-glass or Au—Si, a metal or an adhesive such as ceramics maintaining a thickness of about 50 μm, and is connected to the wiring layer by wire bonding, TAB tape or the like. The wiring board equipped with the insulating substrate formed of the above-mentioned ceramics is effective in mounting the chip (semiconductor device) of the Si type or of the Ga—As type.

Further, a cap made of the insulating material of the same kind as the insulating substrate or of any other insulating material, or of a metal having good heat-radiating property and having electromagnetic wave-shielding property, may be adhered, with an adhesive such as glass, resin or brazing material, onto the surface of the wiring board on which the semiconductor device is mounted, thereby to air-tightly seal the semiconductor device.

(Constitution of the Wiring Board)

FIG. 1 illustrates a concrete structure of a package for accommodating the semiconductor device, which is a high-frequency wiring board fabricated by using the ceramics of the present invention as described above, and the mounted structure thereof. FIG. 1 is a schematic sectional view of a package for accommodating the semiconductor device and, particularly, a ball grid array (BGA)-type package having connection terminals which are ball terminals.

In FIG. 1, a package A is defining a cavity 3 by a closure 2 and an insulating substrate 1 made of the ceramics of the present invention. In the cavity 3 is mounted a chip 4 such as of Si or Ga—As using the above-mentioned adhesive.

A wiring layer 5 is formed on the surface and inside of the insulating substrate 1, and is electrically connected to the chip 4. It is desired that the wiring layer 5 is formed of a low-resistance metal such as copper, silver or gold in order to minimize the conductor loss when the high-frequency signals are being transmitted. When the high-frequency signals of not lower than 1 GHz are to be transmitted, the wiring layer 5 is constituted by at least one of a known strip line, microstrip line, coplanar line or dielectric waveguide line, so that the high-frequency signals are transmitted without loss.

In the package A of FIG. 1, further, a connection electrode layer 6 is formed on the lower surface of the insulating substrate 1, and is connected to the wiring layer 5 in the package A. Ball-like terminals 8 are formed on the connection electrode 6 by using a brazing material 7 such as solder.

The package A is mounted, as shown in FIG. 1, on an external circuit board B having a wiring conductor 10 formed on the surface of the insulating substrate 9 formed of an insulating material containing an organic resin such as polyimide resin, epoxy resin and phenol resin, via a brazing material. Concretely speaking, the package A is mounted by bringing ball-like terminals 8 attached to the lower surface of the insulating substrate 1 into contact with the wiring conductors 10 of the external circuit board B, and brazing them with a solder 11 such as Pb—Sn. Further, the ball-like terminals 8 may be melt-connected to the wiring conductors 10.

According to the surface-mounted package on which the chip 4 such as of Ga—As is mounted by brazing or by using an adhesive, the difference in the thermal expansion of the chip 4 such as Ga—As from the insulating substrate can be suppressed to be smaller than that of when the conventional ceramic material is used. Even when the mounted structure is subjected to the heat cycle, therefore, occurrence of stress in the mounting portion can be suppressed and, as a result, the mounted structure features improved reliability over extended periods of time. It is also allowable to use pole-like terminals (land grid array (LGA)) in place of the ball-like terminals 8 shown in FIG. 1.

EXAMPLES (Experiment 1)

Glasses A to D having the following compositions were used as starting glass powders.

Glass A: $SiO_2$ 50% by wt—$Al_2O_3$ 5.5% by wt—MgO 18.5% by wt—CaO 26% by wt

Glass B: $SiO_2$ 50.2% by wt—$Al_2O_3$ 5.0% by wt—Mgo 16.1% by wt—CaO 15.1% by wt—SrO 13.6% by wt Glass C: $SiO_2$ 51.4% by wtΔ$Al_2O_3$ 34.8% by wt—Mgo 13.8% by wt Glass D: $SiO_2$ 10.4% by wt—$Al_2O_3$ 2.5% by wt—ZnO 35.2% by wt—$B_2O_3$ 45.3% by wt—$Li_2O$ 6.6% by wt Ceramic fillers (purity of 99%) shown in Table 1 were suitably added to the above-mentioned glasses to prepare a mixed powder, to which were further added an organic binder, a plasticizer and toluene to prepare a slurry thereof. By using this slurry, a green sheet having a thickness of 300 μm was prepared by the doctor blade method.

Ten to fifteen pieces of the thus obtained green sheets were laminated one upon another and were heat-adhered together at a temperature of 50° C. under a pressure of 10 MPa. The obtained laminated member was subjected to the binder-removing treatment in a water vapor-containing nitrogen atmosphere at 700° C., and was fired in dry nitrogen under the conditions of Table 1 to obtain ceramics for the insulating substrate. The firing was conducted in two steps at a first firing temperature and at a second firing temperature while raising the temperature and lowering the temperature at a rate of 300° C./hour.

The obtained ceramics were evaluated concerning the following properties. Dielectric Constant and Dielectric Loss:

Measurement was taken relying upon the cylindrical dielectric resonator method at 60 GHz by using a network analyzer and a synthesized sweeper by cutting the ceramics into sizes of 2 to 7 mm in diameter and 1.5 to 2.5 mm in thickness. In taking measurement, the dielectric resonator was excited by using an NRD guide (non-radiating dielectric line), and the dielectric constant and the dielectric loss (tan δ) were calculated from the resonance characteristics in the $TE_{021}$ and $TE_{031}$ modes.

Open Porosity:

Measured in accordance with the Archimedes' method.

Coefficient of Thermal Expansion:

A curve of thermal expansion was plotted from room temperature up to 400° C., and a coefficient of thermal expansion ($\alpha$) was calculated therefrom.

Identification of Crystal Phase:

The crystal phase in the sintered body was identified from an X-ray diffraction chart, the ratio of contents of the diopside crystal phase (Di) and the cordierite crystal phase (Co) was found relying upon the Liedbert' method, and the total amount thereof was calculated.

Strength:

The ceramics was measured for its four-point flexural strength in compliance with JIS-R1601 and for its Vickers' hardness in compliance with JIS-R1610.

By using mixed powders of compositions shown in Table 1, further, green sheets having a thickness of 500 $\mu$m were prepared by the doctor blade method, and a Cu metallized paste was applied maintaining a thickness of 10 $\mu$m onto the surfaces of the sheets by the screen-printing method to form a metallized wiring layer. Further, through holes were formed in the green sheets at predetermined portions and were filled with the Cu metallized paste. Six pieces of the green sheets applied with the metallized paste were positioned among the through holes and were adhered together with pressure.

The laminate was fired under the conditions of Table 1 such that the metallized wiring layer and the insulating substrate were co-fired, thereby to prepare a wiring board on which the metallized wiring layer was formed.

Nickel and gold were plated onto 2-mm squares on the surface of the metallized wiring layer on the surface of the wiring board, copper lead wires were soldered onto the plated films and were pulled from a direction perpendicular to the metallized wiring layer at a rate of 10 mm/second to measure the tensile load (F) with which the metallized wiring layer was peeled off or was broken in order to calculate a ratio F/S relative to the area (S) forming the metallized wiring layer as the metallized strength. The results were as shown in Table 1.

TABLE 1

| Sample | Glass | | | | Ceramic filler | | First firing temperature | | Second firing temperature | | Open porosity | Dielectric |
|---|---|---|---|---|---|---|---|---|---|---|---|---|
| No. | kind | wt % | kind | wt % | kind | wt % | ° C. | hr | ° C. | hr | (%) | constant |
| *1 | A | 100 | — | — | — | — | 850 | 0.5 | 950 | 0.5 | 0.3 | 8.2 |
| 2 | A | 99.5 | C | 0.5 | — | — | 850 | 0.5 | 950 | 1 | 0.2 | 7 |
| 3 | A | 90 | C | 10 | — | — | 850 | 1 | 950 | 1 | 0.2 | 6.9 |
| 4 | A | 80 | C | 20 | — | — | 850 | 1 | 975 | 1 | 0.2 | 6.8 |
| 5 | A | 70 | C | 30 | — | — | 850 | 0.5 | 975 | 1 | 0.2 | 6.7 |
| 6 | A | 60 | C | 40 | — | — | 850 | 0.5 | 975 | 1 | 0.2 | 6.6 |
| 7 | A | 30 | C | 70 | — | — | 850 | 0.5 | 950 | 1 | 0.2 | 6.3 |
| 8 | A | 20 | C | 80 | — | — | 850 | 1 | 950 | 1 | 0.2 | 5.9 |
| 9 | A | 10 | C | 90 | — | — | 850 | 1 | 950 | 1 | 0.2 | 5.6 |
| 10 | A | 0.5 | C | 99.5 | — | — | 850 | 1 | 950 | 1 | 0.2 | 5.2 |
| 11 | A | 81 | C | 9 | $Al_2O_3$ | 10 | 850 | 1 | 950 | 1 | 0.2 | 7.3 |
| 12 | A | 63 | C | 7 | $Al_2O_3$ | 30 | 850 | 1 | 975 | 1 | 0.2 | 7.4 |
| 13 | A | 54 | C | 6 | $Al_2O_3$ | 40 | 850 | 1 | 975 | 1 | 0.2 | 7.5 |
| 14 | B | 45 | C | 5 | $Al_2O_3$ | 50 | 850 | 1 | 975 | 1 | 0.2 | 7.6 |
| 15 | A | 62 | C | 18 | forsterite | 20 | 850 | 1 | 975 | 1 | 0.2 | 7.7 |
| 16 | A | 44 | C | 16 | forsterite | 40 | 850 | 1 | 975 | 1 | 0.2 | 7.9 |
| *17 | A | 70 | — | — | cordierite | 30 | 850 | 1 | 975 | 1 | 5 | 6.1 |
| *18 | — | — | C | 100 | — | — | 850 | 1 | 1000 | 1 | 15 | — |
| *19 | A | 60 | D | 40 | — | — | 850 | 1 | 950 | 1 | 0.6 | 8 |

| Sample No. | tan $\delta$ × $10^{-4}$ | $\alpha$ × $10^{-6}$/° C. | Flexural strength MPa | Metallized strength MPa | Vickers' hardness | Crystal phase[1] | Di + Co ratio |
|---|---|---|---|---|---|---|---|
| *1 | 50 | 9.5 | 210 | 18 | 560 | Di | 80 |
| 2 | 17 | 9 | 260 | 28 | 650 | Di,Co | 95 |
| 3 | 17 | 8.4 | 265 | 28 | 670 | Di,Co | 97 |
| 4 | 16 | 8 | 270 | 28 | 670 | Di,Co | 98 |
| 5 | 16 | 7.5 | 260 | 28 | 670 | Di,Co | 100 |
| 6 | 15 | 7 | 255 | 28 | 670 | Di,Co | 100 |
| 7 | 10 | 6 | 255 | 28 | 680 | Di,Co | 100 |
| 8 | 12 | 5 | 250 | 28 | 680 | Di,Co | 98 |
| 9 | 14 | 4 | 250 | 28 | 680 | Di,Co | 97 |
| 10 | 16 | 2.5 | 250 | 28 | 670 | Di,Co | 97 |
| 11 | 12 | 7 | 270 | 28 | 670 | Di,Co,Al | 89 |
| 12 | 11 | 7.2 | 290 | 32 | 680 | Di,Co,Al | 68 |
| 13 | 10 | 7.3 | 300 | 32 | 680 | Di,Co,Al | 59 |
| 14 | 11 | 7.4 | 290 | 32 | 670 | Di,Co,Fo | 50 |
| 15 | 10 | 8.7 | 290 | 33 | 670 | Di,Co,Fo | 78 |
| 16 | 11 | 9 | 290 | 34 | 670 | Di,Co,Fo | 59 |
| *17 | 22 | 7.1 | 190 | 12 | 400 | Di,Co | 68 |
| *18 | — | — | — | — | 420 | Co | 40 |
| *19 | 98 | 6 | 100 | 10 | 300 | reacted, decomposed | — |

Samples marked with * lie outside the scope of the invention.

Note

[1]D: diopside crystal phase, Co: cordierite crystal phase, Al: alumina crystal phase, Fo: forsterite crystal phase, As will be obvious from the results of Table 1, a sample No. 1 without using the cordierite crystal phase-precipitating glass and without containing the cordierite crystal phase in the ceramics, exhibited a large dielectric constant, a large dielectric loss, a small flexural strength, a small Vickers' hardness, and a small metallized strength.

In a sample No. 19 obtained by adding an amorphous glass only to the diopside crystal phase-precipitating glass, the glasses reacted with each other and decomposed without precipitating the diopside crystal phase and, hence, exhibiting a large dielectric loss, a small flexural strength, a small metallized strength and a small Vickers' hardness.

A sample No. 17 obtained by adding the cordierite as a filler exhibited an open porosity of not smaller than 1%, a large dielectric loss, a small flexural strength and a small Vickers' hardness.

A sample No. 18 without using the diopside crystal phase-precipitating glass and without containing the diopside crystal phase in the ceramics, could not be densely formed even through the firing at 1000° C. and exhibited an increased open porosity.

On the other hand, samples Nos. 2 to 16 containing both the diopside crystal phase and the cordierite crystal phase and having open porosities of not larger than 1% as contemplated by the present invention, exhibited excellent properties such as dielectric constants of not larger than 8 and dielectric losses of not larger than $20 \times 10^{-4}$ measured at a frequency of 60 GHz, coefficients of thermal expansion of not smaller than 2.5 to $9 \times 10^{-6}/°$ C., ceramic strengths of not smaller than 250 MPa, Vickers' hardnesses of not smaller than 650 and metallized strengths of not smaller than 20 MPa.

As described above in detail, the ceramics of the present invention is obtained through the firing at a low temperature which is not higher than 1000° C. enabling the wiring layer of a low-resistance metal such as of copper to be co-fired, exhibiting a dielectric constant of not higher than 8 in a high-frequency region of not lower than 1 GHz and a dielectric loss of as small as $20 \times 10^{-4}$ or smaller at 60 GHz. Therefore, the ceramics of the present invention is capable of very favorably transmitting high-frequency signals without loss.

Besides, the ceramics of the present invention exhibits a ceramic strength of not smaller than 250 MPa, a Vickers' hardness of not smaller than 650, and can be controlled to exhibit a coefficient of thermal expansion close to that of the semiconductor device such as Si chip or Ga—As chip. Accordingly, the ceramics of the present invention exhibits excellent resistance against the heat cycles when the Si chip or the Ga—As chip is mounted thereon, offering a highly reliable mounted structure.

What we claim is:

1. A ceramic comprising: a diopside crystal phase, a cordierite crystal phase, and at least one phase selected from the group consisting of a glass phase and other ceramic crystal phases, the ceramic having an open porosity of not larger than 1%, wherein the total content of said diopside crystal phase and said cordierite crystal phase is not smaller than 50% by weight.

2. The ceramic according to claim 1, wherein both said diopside crystal phase and said cordierite crystal phase are those precipitated from glass powders.

3. The ceramic according to claim 1, wherein the flexural strength is not smaller than 250 Mpa, the Vickers' hardness is not smaller than 650, the dielectric constant is not larger than 8, and the dielectric loss at 60 0 Hz is not larger than $20 \times 10^{-4}$.

4. The ceramic according to claim 1, wherein said ceramic contains a ceramic crystal phase of at least one selected from the group consisting of alumina, mullite, forsterite, enstatite, cordierite, anorthite, stawsonite, celsian, spinel, gahnite, silica, zirconia, titania, $MgTiO_3$, $(Mg, Zn)TiO_3$, $Mg_2TiO_4$, $Zn_2TiO_4$, $CaTiO_3$, $SrTiO_3$, $Si_3N_4$, SiC and AlN.

5. A method of preparing ceramics comprising:

preparing a mixed powder containing a first glass powder capable of precipitating a diopside crystal phase and a second glass powder capable of precipitating a cordierite crystal phase;

molding said mixed powder; and firing the obtained molded article at a temperature of from 800 to 1050° C., so that the diopside crystal phase and the cordierite crystal phase are precipitated from the first and second glasses, respectively.

6. A method of preparing ceramics according to claim 5, wherein not smaller than 80% by weight of said first glass powder and said second glass powder are crystallized into the diopside crystal phase and the cordierite crystal phase.

7. A method of preparing ceramics according to claim 5, wherein the firing is conducted in two steps of from 800 to 900° C. and from 910 to 1000° C.

8. A method of preparing ceramics according to claim 5, wherein said mixed powder contains a ceramic powder that is not decomposed by the firing.

9. A wiring board comprising an insulating substrate provided with a wiring layer, said insulating substrate being formed of a ceramic comprising: a diopside crystal phase, a cordierite crystal phase, and at least one phase selected from the group consisting of a glass phase and other ceramic crystal phases, the ceramic having an open porosity of not larger than 1%.

10. A wiring board according to claim 9, wherein said wiring layer is formed on the surface and/or inside of the insulating substrate.

11. A wiring board according to claim 9, wherein said wiring layer contains copper or silver as a conducting component.

12. A wiring board comprising an insulating substrate provided with a wiring layer, said insulating substrate being formed of the ceramic of claim 1.

13. The wiring board according to claim 12, wherein said wiring layer is formed on the surface and/or inside of the insulating substrate.

14. The wiring board according to claim 12, wherein said wiring layer contains copper or silver as a conducting component.

15. A ceramic comprising: a diopside crystal phase and a cordierite crystal phase, the ceramic having an open porosity of not larger than 1%, wherein the total content of said diopside crystal phase and said cordierite crystal phase is not smaller than 50% by weight.

* * * * *